United States Patent [19]

Blaske et al.

[11] 4,194,934

[45] Mar. 25, 1980

[54] METHOD OF PASSIVATING A SEMICONDUCTOR DEVICE UTILIZING DUAL POLYCRYSTALLINE LAYERS

[75] Inventors: Theodore A. Blaske, Plano; Ho Y. Yu, Richardson, both of Tex.

[73] Assignee: Varo Semiconductor, Inc., Garland, Tex.

[21] Appl. No.: 28,836

[22] Filed: Apr. 10, 1979

Related U.S. Application Data

[62] Division of Ser. No. 799,467, May 23, 1977, Pat. No. 4,161,744.

[51] Int. Cl.$^2$ .................. H01L 21/205; H01L 29/04
[52] U.S. Cl. ................................ 148/174; 148/1.5;
148/187; 357/52; 357/54; 357/59; 427/85;
427/86; 427/93; 427/255.2; 427/255.7
[58] Field of Search ............... 148/1.5, 174, 187;
427/85, 86, 93, 95, 248 B, 248 C, 248 J; 357/52,
54, 59

[56] References Cited

U.S. PATENT DOCUMENTS

| | | | |
|---|---|---|---|
| 3,859,127 | 1/1975 | Lehner | 427/82 |
| 3,971,061 | 7/1976 | Matsushita et al. | 357/59 X |
| 3,977,019 | 8/1976 | Matsushita et al. | 357/52 X |
| 4,001,873 | 1/1977 | Kajiwara et al. | 357/59 |
| 4,002,512 | 1/1977 | Lim | 148/174 X |
| 4,014,037 | 3/1977 | Matsushita et al. | 357/59 X |
| 4,080,619 | 3/1978 | Suzuki | 357/52 X |
| 4,086,613 | 4/1978 | Biet et al. | 427/93 X |

FOREIGN PATENT DOCUMENTS

300472 4/1968 Sweden ....................... 357/59

Primary Examiner—R. Dean
Assistant Examiner—W. G. Saba
Attorney, Agent, or Firm—Trexler, Wolters, Bushnell & Fosse, Ltd.

[57] ABSTRACT

A semiconductor device is surface-passivated by a multi-layer film which includes a base coat of substantially undoped polycrystalline silicon in intimate contact with the substrate and bridging the semiconductor junction. A top coat of polycrystalline silicon is doped with oxygen and disposed overlying the base coat.

The method of passivating a semiconductor device includes initial formation of a base layer of substantially undoped polycrystalline silicon from a controlled atmosphere of a silane material. This is advantageously followed by a deposition of oxygen-doped polycrystalline silicon in continuation of the atmosphere of silane material with the added introduction of a gaseous oxygen donor.

3 Claims, 2 Drawing Figures

METHOD OF PASSIVATING A SEMICONDUCTOR DEVICE UTILIZING DUAL POLYCRYSTALLINE LAYERS

This is a division, of application Ser. No. 799,467, filed May 23, 1977 now U.S. Pat. No. 4,161,744.

BACKGROUND OF THE INVENTION

This invention relates generally to semiconductor devices and more particularly to surface-passivated semiconductor devices, adaptable for high-performance applications, and to methods of fabricating such items.

Since the commercial advent of semiconductor products, there has been an intense and continuing search for ways of increasing their reliability, especially under conditions of high electrical and enviornmental stress. Surface passivation techniques have received considerable attention in this quest; and passivation has been practiced in the past by means of organic coatings, glass compositions, and both deposited and thermally formed films of silicon dioxide. More recently, coatings of both silicon nitride and polycrystalline silicon doped with oxygen have been proposed.

Each of the prior art schemes has disadvantages. Organic passivations require skilled workers for their application, present hazards to the factory environment, and fail to exhibit optimized electrical properties at the interface with the semiconductor body proper, due at least in part to poor molecular bonding with the substrate material. Glass passivations, on the other hand, usually have limited tolerance to processing chemicals, are sensitive to assembly procedures, and sometimes display erratic electrical behavior. Silicon dioxide passivation films are mechanically weak, have extremely unstable surface charges, and are susceptible to undesirable migration of such alkali metal ions as sodium ion, resulting in failure of the electrical isolation. Silicon nitride passivation coatings are difficult to etch in a sharp pattern and exhibit undesirable dipolar effects with concomittant reduction in reverse voltage properties. Finally, simple oxygen-doped polycrystalline silicon passivations permit unacceptable electrical leakage upon prolonged exposure of the coated semiconductor device to elevated temperatures.

It is therefore a general object of the present invention to provide a new and improved surface-passivated semiconductor device which overcomes many of the limitations of the prior art and which can be operated in a continuous manner under exacting conditions.

Another object of the invention is to provide a high-performance semiconductor device which includes a multi-layer passivation of semi-insulating character.

Still another object of the invention is to provide a surface-passivated semiconductor device which functions reliably at high operating voltages.

And still another object of the invention is to provide a surface-passivated semiconductor device which counteracts the development of both static and mobile electrical charges in the vicinity of the interface between the passivation layer and the substrate.

A further object of the invention is to provide a new and improved method of surface-passivating semiconductor devices.

A yet further object of the invention is to provide a method of continuously applying a dual-layer passivation coating to semiconductor devices.

These and other objects and features of the invention will become apparent from a consideration of the following descriptions.

BRIEF DESCRIPTION OF THE DRAWING

In order that the principles of the invention may be readily understood, a single embodiment thereof, applied to a simple mesa rectifier but to which the application is not to be restricted, is shown in the accompanying drawing wherein.

DESCRIPTION OF THE ILLUSTRATED EMBODIMENT

Figure 1:
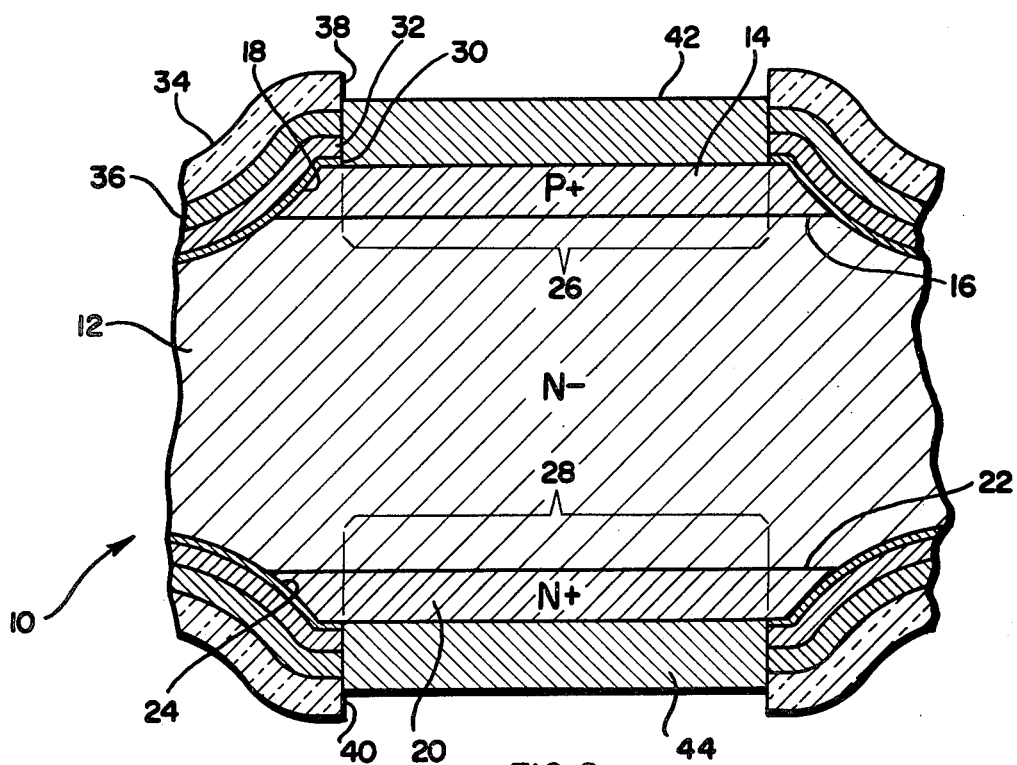
FIG. 1 is a schematic cross-sectional view taken in elevation and showing a mesa rectifier constructed in compliance with the present invention.

Referring now in detail to the drawing, specifically to FIG. 1, a mesa rectifier indicated generally by the reference numeral 10 is constructed from a semiconductor body 12 of monocrystalline substrate material, such as high resistivity N-type single crystal silicon. In compliance with conventional practice, one surface region of the substrate body 12 is infused with a positive current carrier or dopant, such as boron, to form a high conductivity P-type diffused layer 14. Diffusion of the P-type impurity into the substrate body 12 creates a boundary region 16 interjacent the diffused layer 14 and the substrate material whereby to define a semiconductor junction; and in formation of the mesa rectifier 10, this boundary region is exposed at an edge surface 18 which is etched or otherwise suitably created in the body 12.

In like manner, a different surface region of the substrate body 12 is infused with a high conductivity N-type impurity or dopant, such as phosphorus, in order to produce a cooperating diffusion layer 20 which forms a boundary region 22 with the substrate material, boundary region 22 defining a semiconductor concentration gradient which is exposed at an edge surface 24. Edge surface 24 is generated in the same manner as edge surface 18. As will be appreciated, after the described diffusions have taken place, an anode area 26 and a cathode area 28 are defined using conventional masking techniques; and the double-diffused substrate is thereafter etched or otherwise processed to form the two-sided mesa structure illustrated in the drawing whereby to establish the respective edge surfaces 18 and 24. The amount of material that is etched away or otherwise removed is determined by the desired characteristics in the final device; but in any event, the etch depth is at least great enough to provide for isolation of the anode diffusion layer 14.

In compliance with the present invention, a novel multi-layer passivation film is deposited on selected surface portions of the semiconductor body 12, especially bridging over the semiconductor junction at the boundary 16 where it is laterally exposed at the edge region 18. In particular, this multi-layer passivation film comprises a comparatively thin base or prime coat 30 of substantially undoped polycrystalline silicon disposed in intimate contact with the semiconductor body 12. Advangtageously, a second coat 32 of oxygen-doped polycrystalline silicon is applied over the base coat 30. The resultant passivation film insures electrical integrity of the final semiconductor device.

While the semiconductor body 12 is made up of a single macrocrystal, the passivation film comprising the layers 30 and 32 consists of many grains of individual silicon crystals which are typically a few hundred angstroms in diameter. It has been found that the passivation achieved by the coatings 30 and 32 is markedly diminished when their consistency is amorphous. The oxygen-doped coat 32 of the passivation film is believed to comprise silicon dioxide or silicon monoxide co-deposited with the crystals of silicon, or elemental oxygen either complexed within the silicon crystal lattice or disposed along the crystal grain boundaries.

The prime coat 30 of substantially pure polycrystalline silicon has been described hereinabove as being comparatively thin; and useful layers in this regard have been found to be at least 100 angstroms and no greater than about 1000 angstroms in thickness when produced by low pressure, chemical vapor deposition techniques. Additionally, the second coat 32 is advantageously at least about twice as thick as the base coat 30.

In order to promote the enviornmental and mechanical protection of the mesa rectifier 10, an inorganic encapsulation coating 34 is applied over the passivation film; and in addition, enhanced electrical properties are achieved by interposing an intermediate encapsulation film 36, preferably of silicon nitride, between the finish layer 34 and the coat 32 of the passivation film, or as a substitute for the coat 32. The film 36 of silicon nitride preserves the passivation material from invasion by environmental moisture, acts as a barrier against ion migration and ininhibits the mobility of surface electrical charge at the interface 18. The silicon nitride layer additionally protects both the interface 18 and the passivation film against attack by either wet chemicals or the free-electron plasma sometimes used in etching. The material for the final encapsulation layer 34 may be selected, for example, from among the various commercial, low-melting glass compositions available for the purpose; and in this regard, lead-borosilicate glasses have proved eminently useful.

After final encapsulation by means of the coating 34, the mesa rectifier 10 is provided with low-resistance terminals or contacts in channels 38 and 40, respectively defining an anode 42 and a cathode 44.

Figure 2:
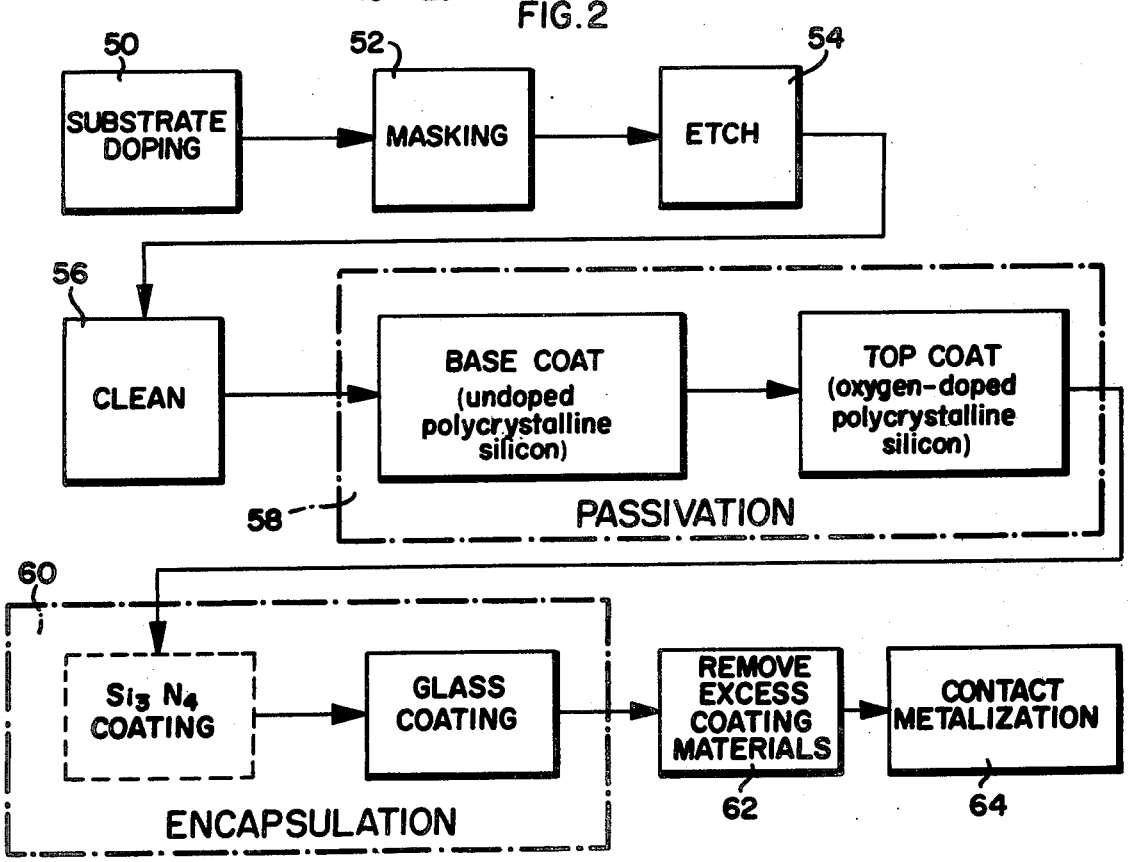
FIG. 2 is a schematic block diagram outlining the manufacture of a surface-passivated semiconductor device in accordance with the procedural aspects of the instant invention.

The method aspects of the present invention will now be described with reference to FIG. 2 where the principal steps in fabricating the mesa rectifier 10 are shown schematically. As mentioned hereinabove, one or more wafers of single crystal silicon are made metallurgically clean and then doped with suitable P-type and N-type impurities using a conventional technique such as chemical vapor deposition, as is suggested in step 50. After diffusing the dopants into selected surfaces of the substrate material, the anode and cathode areas are defined by masks of standard photoresist material or the like, as indicated in the step that has been identified by the reference numeral 52; and the silicon wafers are thereafter etched to generate a mesa configuration, by wet chemical processes or by a plasma of free electrons produced by the radio-frequency excitation of a suitable gas such as carbon tetrafluoride. This etching step is indicated at 54 in FIG. 2.

After mesa etching, the surfaces which are to receive the passivation film will be cleaned of all ionic and organic contaminants, as by means of a wet chemical process followed by a temporally abbreviated etch using hydrogen chloride gas at processing temperature, for example. This cleaning step is indicated at 56. Thereafter, the multi-layer passivation coating will be applied, as suggested at 58, advantageously by low pressure chemical vapor deposition procedures, exposing the prepared semiconductor wafers to an atmosphere consisting essentially of an inert gas such as nitrogen and a silane material, preferably monosilane, at a selected elevated temperature. The nature of the silane material and the desired depth of coating determine the particular processing times; and temperatures ranging from 150° C. to 1000° C. have proved useful in the practice of the present invention.

After the prepared silicon wafers are properly located in the processing chamber, in compliance with an important feature of the present invention, a mixture of the silane material and any inert gas being employed is first introduced into the chamber without any oxygen donor material present in order to deposit a prime coat of substantially pure (undoped) polycrystalline silicon. After a suitable application time for the prime coat, on the order of 3.5 to 5 minutes, depending upon the temperature and the concentration of the silane material for example, a gaseous oxygen donor will thereupon be introduced into the chamber in continuation of the atmosphere of silane material in order to deposit a second layer of oxygen-doped polycrystalline silicon over the base coat in formation of one passivation coating of the invention.

The gaseous oxygen donor is advantageously selected to be nitrous oxide, and the ratio of silane material to nitrous oxide is desirably controlled so that the oxygen concentration in the coat 32 is held to less than 30% by weight of the film, and preferably in the range of 5–20%, in order to prevent deposition of any appreciable amount of amorphous silicon and in order to insure that the oxygen-doped film is semi-insulating in nature. Other methods of introducing the oxygen dopant may be employed. For instance, oxygen gas may be substituted for nitrous oxide as the oxygen donor.

After passivation, the processed wafers will be encapsulated as indicated at 60; and preferably, a silicon nitride coating is applied directly to the uppermost coat of the passivation film by means of such known techniques as chemical vapor deposition from an atmosphere of monosilane and ammonia. The silicon nitride layer is followed by coating with lead-borosilicate glass, quartz (silicon dioxide), phosphorus-doped quartz or the like. Thereafter, excess coating materials, including any mask employed, will be removed chemically as indicated at 62 to define the anode and cathode areas of the semiconductor device; and contacts of a suitable low-resistance material, such as nickel, will be applied to the anode and cathode areas by plating, evaporation or chemical vapor deposition, as indicated by step 64. The separation of individual mesa rectifiers from each processed wafer will be accomplished then by selection from such methods as diamond scribing, laser scribing and chemical dicing or by sawing with an abrasive media such as diamond dust impregnated discs.

While the invention has been described with reference to a mesa rectifier, the instant passivation principles may be equally well applied to other solid state configurations, including planar, moat and epiplanar arrangements, in developing transistors, zener diodes, power rectifiers, integrated circuits and the like.

It will thus be appreciated that the drawing and the foregoing descriptions are not intended to represent the only form of the invention in regard to the details of its construction and manner of fabrication. Changes in form and in the proportion of parts, as well as the substitution of equivalents, are contemplated as circumstances may suggest or render expedient; and although specific terms have been employed, they are intended in a generic and descriptive sense only and not for the purposes of limitation, the scope of the invention being delineated in the following claims.

The invention is claimed as follows:

1. The method of making semiconductor devices, which is characterized by the steps of: infusing a selected portion of the surface of a semiconductor body of monocrystalline substrate material with dopant material to form a diffusion layer having a boundary region with the parent substrate material, which boundary region acts as a semiconductor junction; preparing the junction region of said body to receive a passivation coating; exposing said prepared semiconductor body to an atmosphere consisting essentially of an inert gas and a silane material at a selected, elevated temperature whereby to deposit a base layer of essentially undoped polycrystalline silicon over the region of said junction region; and thereafter introducing a gaseous oxygen donor into said atmosphere in continuation of the presence of inert gas and silane material whereby to deposit a top layer of oxygen-doped polycrystalline silicon over said base layer and form a dual-layer passivation coating, wherein said top layer contains less than about 30% by weight of oxygen.

2. A method according to claim 1 wherein said oxygen donor is nitrous oxide.

3. A method according to claim 1 wherein said silane material is monosilane.

* * * * *